(12) United States Patent
Hinrichsen et al.

(10) Patent No.: US 6,496,063 B2
(45) Date of Patent: Dec. 17, 2002

(54) SELECTABLE DIODE BIAS FOR POWER AMPLIFIER CONTROL IN A WIRELESS TELEPHONE HANDSET

(75) Inventors: Carsten Hinrichsen, Aalborg (DK); Lionel Pauc, Saint Vallier de Thiey (FR)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/997,945

(22) Filed: Nov. 29, 2001

(65) Prior Publication Data

US 2002/0084846 A1 Jul. 4, 2002

Related U.S. Application Data

(60) Provisional application No. 60/251,188, filed on Dec. 4, 2000.

(51) Int. Cl.[7] .................................................. H03G 3/20
(52) U.S. Cl. ....................................... 330/129; 330/285
(58) Field of Search ................................. 330/129, 285, 330/124 R, 295, 290

(56) References Cited

U.S. PATENT DOCUMENTS

| | | | | |
|---|---|---|---|---|
| 5,204,637 A | * | 4/1993 | Trinh .......................... | 330/129 |
| 5,438,683 A | | 8/1995 | Durtler et al. | |
| 5,960,333 A | | 9/1999 | Repke et al. | |
| 6,163,709 A | | 12/2000 | Chorey et al. | |
| 6,188,498 B1 | * | 2/2001 | Link et al. .................... | 359/187 |
| 6,229,293 B1 | * | 5/2001 | Farrenkopf ................. | 323/288 |
| 6,236,271 B1 | | 5/2001 | Vakilian | |
| 6,281,748 B1 | * | 8/2001 | Klomsdorf et al. ......... | 330/129 |

FOREIGN PATENT DOCUMENTS

EP 0 509 733 A2 10/1992

OTHER PUBLICATIONS

"The Zero Bias Schottky Detector Diode", Application Note 969 (Agilent Technologies, Inc., 1999).
"Schottky Barrier Diode Video Detectors", Application Note 923 (Agilent Technologies, Inc., 1999).
"Surface Mount Zero Bias Schottky Detector Diodes: Technical Data" (Agilent Technologies, Inc., 1999).
"Dynamic Range Extension of Schottky Detectors", Application Note 956–5 (Hewlett Packard Co., 1975).
"Dynamic Range Extension of Schottky Detectors", Application Note 956–5 (Agilent Technologies, Inc., 1999).
Patent Abstract of Japan, vol. 012, No. 465 (E–690), Jul.12, 1988 & JP 63 187820A (Hitachi Denshi Ltd), Mar. 08, 1988 Abstract.

* cited by examiner

*Primary Examiner*—Robert Pascal
*Assistant Examiner*—Henry Choe
(74) *Attorney, Agent, or Firm*—Ronald O. Neerings; Wade James Brady, III; Frederick J. Telecky, Jr.

(57) ABSTRACT

A power amplifier controller (45) for a wireless communications device (10), such as a wireless telephone, is disclosed. The power amplifier controller (45) has includes controllable bias current sources (56, 58) coupled to Schottky diodes (60), which are coupled to power amplifiers (50) to sense their power output. The controllable bias current sources (56, 58) selectably apply one of multiple available bias currents (I1, I2) to their corresponding Schottky diodes (60F, 60R). Timing and control circuitry (62) in the power amplifier controller (45) receives a desired power level signal (DESPWR), and control switches (SW1, SW2) in the controllable bias current sources (56, 58) to apply a bias current (I1, I2) responsive to the level of power indicated by the desired power level signal (DESPWR). The power detected by Schottky diodes (60F, 60R) is applied to a summing adder (65), from which a control signal (VAPC) is derived and used to control the output of the power amplifiers (50). The controllable bias currents (I1, I2) permit the power output to be selectably sensed with high dynamic range or high sensitivity, depending upon the power level to be applied.

20 Claims, 3 Drawing Sheets

SELECTABLE DIODE BIAS FOR POWER AMPLIFIER CONTROL IN A WIRELESS TELEPHONE HANDSET

CROSS-REFERENCE TO RELATED APPLICATIONS

This application claims priority, under 35 U.S.C. §119(e), of Provisional Application No. 60/251,188, filed Dec. 4, 2000.

STATEMENT REGARDING FEDERALLY SPONSORED RESEARCH OR DEVELOPMENT

Not applicable.

BACKGROUND OF THE INVENTION

This invention is in the field if wireless telephony, and is more directed to the control of power amplifiers in wireless telephone handsets.

Modern advanced mobile computing devices and wireless telephone handsets are evolving from the so-called second generation (2G) technologies for wireless communications toward the capability of providing the so-called third generation (3G) wireless services. These 3G services are expected to extend current second generation voice and data services, by including new very high bandwidth entertainment services such as video and CD quality audio, interactive messaging including video and graphics, videoconferencing, video streaming, and remote control and monitoring services.

Examples of 2G communications standards include Global System for Mobile (GSM). Extensions of these approaches that are evolving toward 3G services include Enhanced Data rates for GSM Evolution (EDGE), which involves an eight-level phase shift keying (8-PSK) modulation of a 200 kHz carrier, and CDMA 2000, which is an evolution from the TIA IS-95 code division multiple access (CDMA) standard. 3G cellular techniques are expected to include the Universal Mobile Telecommunications System (UMTS) and UTRA standards. In addition to these longer range techniques, the so-called Bluetooth short-distance wireless technology is also becoming popular in the art, for communication between wireless peripheral devices and computer workstations. Another example of an extended service is General Packet Radio System (GPRS), which is a nonvoice value added service that allows information to be sent and received across a mobile telephone network, for example operating as a GSM or TDMA service, and including such functions as chat, text and image communication, file transfer, home automation, and the like. It is contemplated that these and other wireless standards will be implemented in the industry.

The ability to successful transmit the high data rates required by current and future wireless services depends upon the signal-to-noise ratio at the frequencies of interest. Of course, higher data rates can be attained if the transmission power is increased. However, in order to limit interference among wireless communications, and between wireless transmissions and other radio services, communications standards generally include a specification on the maximum transmission power to be used by a wireless device. These specified power limits can be expressed in many forms, including absolute power levels, a specified power over time profile as in the case of GSM communications, and the like.

In order to maintain operation of a wireless telephone device within the appropriate power specification, as well as for general operating stability and battery life concerns, conventional wireless telephone devices include closed-loop feedback control of power amplifier circuits used for transmission. In general, conventional power amplifier controllers receive a feedback signal corresponding to the current level of power output from the power amplifiers in the device, and compare this measured power output against a desired power level signal to produce an error signal. This error signal is then used to control an input to the power amplifiers so that the output power eventually matches the desired power level.

Conventional power detection circuits for various applications, such as video detector circuits and video receiver circuits, have included semiconductor diode detectors, for example Schottky diode circuits. Examples of such power detectors are described in "The Zero Bias Schottky Detector Diode", Application Note 969 (Agilent Technologies, Inc., 1999), "Schottky Barrier Diode Video Detectors", Application Note 923, (Agilent Technologies, Inc., 1999), and "Surface Mount Zero Bias Schottky Detector Diodes: Technical Data" (Agilent Technologies, Inc., 1999). These circuits typically receive radio frequency signal inputs, and the Schottky diode detector effectively produces a voltage that is proportional to the power of the input radio frequency signal. However, conventional Schottky diode detectors are inadequate for use as detectors for power amplifier control in wireless telephones, because the dynamic range of Schottky diode detector circuits is not adequate for this application. For example, in a conventional GSM telephone, the transmission power can vary over a dynamic range of 70 dB. Conventional Schottky diode detectors are incapable of accurately detecting power levels over such a wide dynamic range.

This dynamic range limitation has been addressed by other known power detector circuits for detecting power output in connection with wireless telephones, an example of which is the logarithmic detector. U.S. Pat. No. 6,163,709 discloses an example of a logarithmic detector for detecting power amplifier output in a wireless telephone. As disclosed in this U.S. Pat. No. 6,163,709, the logarithmic detector circuit includes a series of amplifiers that saturate at different current levels. Each amplifier output is connected to a detector circuit that generates an output signal corresponding to the power of the associated amplifier. These output signals are summed to produce the output of the logarithmic detector.

While the logarithmic detector circuit is capable of sensing power levels over a wide dynamic range, the circuit and others like it are quite complex, typically involving several amplifier and detector stages. Accordingly, significant integrated circuit chip area and power are consumed by these conventional power detector circuits. Especially considering the important of conservation of power in battery-powered devices such as wireless telephones, the cost of the logarithmic detector can be substantial.

By way of further background, "Dynamic Range Extension of Schottky Detectors", Application Note 956-5 (Hewlett Packard Co., 1975), reprinted as "Dynamic Range Extension of Schottky Detectors", Application Note 956-5 (Agilent Technologies, Inc., November 1999), discloses that dynamic range of a Schottky diode detector increases with increasing bias current, and that the tangential signal sensitivity (TSS) of such a detector decreases with increasing bias current. This article also discloses that the dynamic range of a Schottky detector can be extended by using a relatively high bias current.

BRIEF SUMMARY OF THE INVENTION

It is therefore an object of the present invention to provide an efficient power detector circuit that operates over a wide dynamic range.

It is a further object of the present invention to provide such a circuit that can be constructed using conventional manufacturing processes.

It is a further object of this invention to provide such a circuit that occupies relatively little integrated circuit chip area.

Other objects and advantages of the present invention will be apparent to those of ordinary skill in the art having reference to the following specification together with its drawings.

The present invention may be implemented into a power amplifier control function for a radio frequency device, such as a wireless telephone. The power amplifier control function includes a Schottky diode power detector circuit, and control circuitry for controlling the bias current applied to the Schottky diode, responsive to the power range within which the power amplifiers are operating. Adjustment of the Schottky diode bias current with increasing and decreasing output power levels provides a wide dynamic operating range for the detector, and thus for the power amplifier control function.

DETAILED DESCRIPTION OF THE INVENTION

This invention will now be described in connection with its preferred embodiment. More specifically, this invention is contemplated to be especially beneficial when used in a wireless telephone. Therefore, the preferred embodiment of this invention will be described in connection with an exemplary architecture for a wireless telephone. However, it is contemplated that this invention may be used in connection with wireless telephones of other architectures, and with devices and systems other than wireless telephones, particularly those in which power detection over a wide dynamic range is desired. It is therefore to be understood that those alternative implementations, and other alternative applications of this invention that will become apparent to those skilled in the art having reference to this specification, are within the true scope of this invention as claimed.

Figure 1:
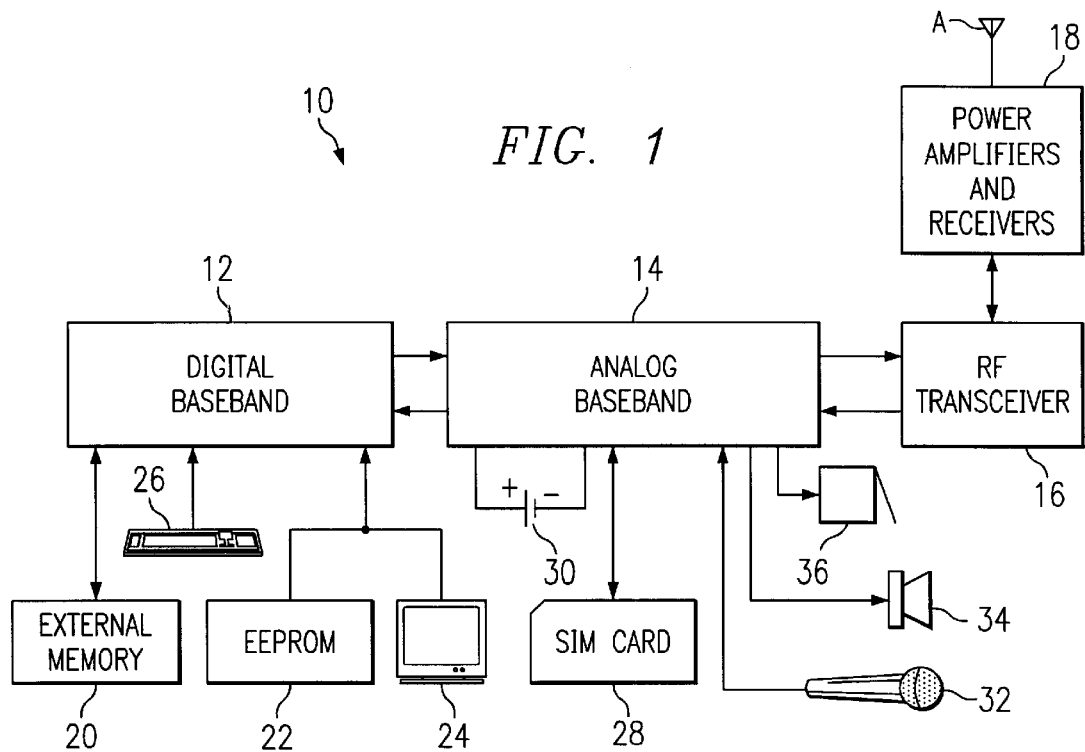
FIG. 1 is an electrical diagram, in block form, of a wireless telephone constructed according to the preferred embodiment of the invention.

FIG. 1 illustrates wireless telephone 10 according to the preferred embodiment of the invention. Wireless telephone 10 includes both digital and analog functions for processing wireless communications. It is contemplated that the preferred embodiment of the invention will be especially useful in connection with advanced wireless services, in other words including not only voice communications but also extended services such as provided according to the General Packet Radio System (GPRS) standard. Examples of these extended services include chat, text and image communication, file transfer, home automation, and the like. Because these extended services are contemplated to be carried out in the digital domain, significant digital capability is contemplated to be provided within wireless telephone 10.

As shown in FIG. 1, digital baseband function 12 of wireless telephone 10 is connected to various functions, including external memory 20, LCD display 24, and keypad 26. Digital baseband function 12 is also connected to program memory 22, which in this example is configured as electrically erasable programmable read-only memory (EEPROM). Digital baseband function 12 is contemplated to be a high performance digital subsystem, and preferably includes programmable logic of significant computing capacity, in combination with such other functions as memory, a direct memory access (DMA) controller, hardware acceleration circuitry for performing encryption operations, universal asynchronous receiver/transmitter (UART) circuitry, and the like. In general, digital baseband function 12 is contemplated to perform such functions as voice-band and radio-frequency coder/decoder ("codec") functions, for encoding and decoding digital data into the form desired for modulation on the transmit side, and for output to the user on the receive side. External memory 20 provides additional memory if necessary to digital baseband function 12, and program memory 20 provides programmable storage of software routines executable by digital baseband function 12.

Analog baseband function 14 is bidirectionally coupled to digital baseband function 12 on one side, and to RF transceiver 16 on another side. Analog baseband function 14 is contemplated to perform much of the analog processing requirements of wireless telephone 10. These functions include receiving input analog signals from microphone 32, and performing the necessary filtering and analog signal processing prior to analog-to-digital conversion and forwarding of the digital result to digital baseband function 12 for encoding. In addition, analog baseband function 14 also performs analog filtering and processing on signals received from digital baseband function 12 for output via speaker 34 and buzzer 36. Analog baseband function 14 also is responsible, in this example, for analog filtering, modulation, and demodulation, on signals are forwarded from digital baseband function 12 to RF transceiver 16, and vice versa. Analog baseband function 14 also performs power management functions for wireless telephone 10, and as such is coupled to battery 30 for monitoring and recharging. SIM card 28 is also coupled to analog baseband 14, to provide additional memory capacity.

An example of digital baseband function 12 is the TBB2100 Digital Baseband integrated circuit available from Texas Instruments Incorporated. In this example, digital baseband function 12 includes two programmable cores, one of which is a digital signal processor (DSP) such as the TMS320C54x DSP from Texas Instruments Incorporated. An example of analog baseband function 14 is the TWL3014 Analog Baseband integrated circuit available from Texas Instruments Incorporated.

RF transceiver 16, which performs all of the RF signal generation and processing in wireless telephone 10, is bidirectionally coupled between analog baseband function 14 and power amplifiers and receivers block 18. Power amplifiers and receivers block 18 amplifies RF signals from RF transceiver 16 for transmission over antenna A, and receives incoming signals from antenna A and forwards these received signals to RF transceiver 16.

Figure 2:
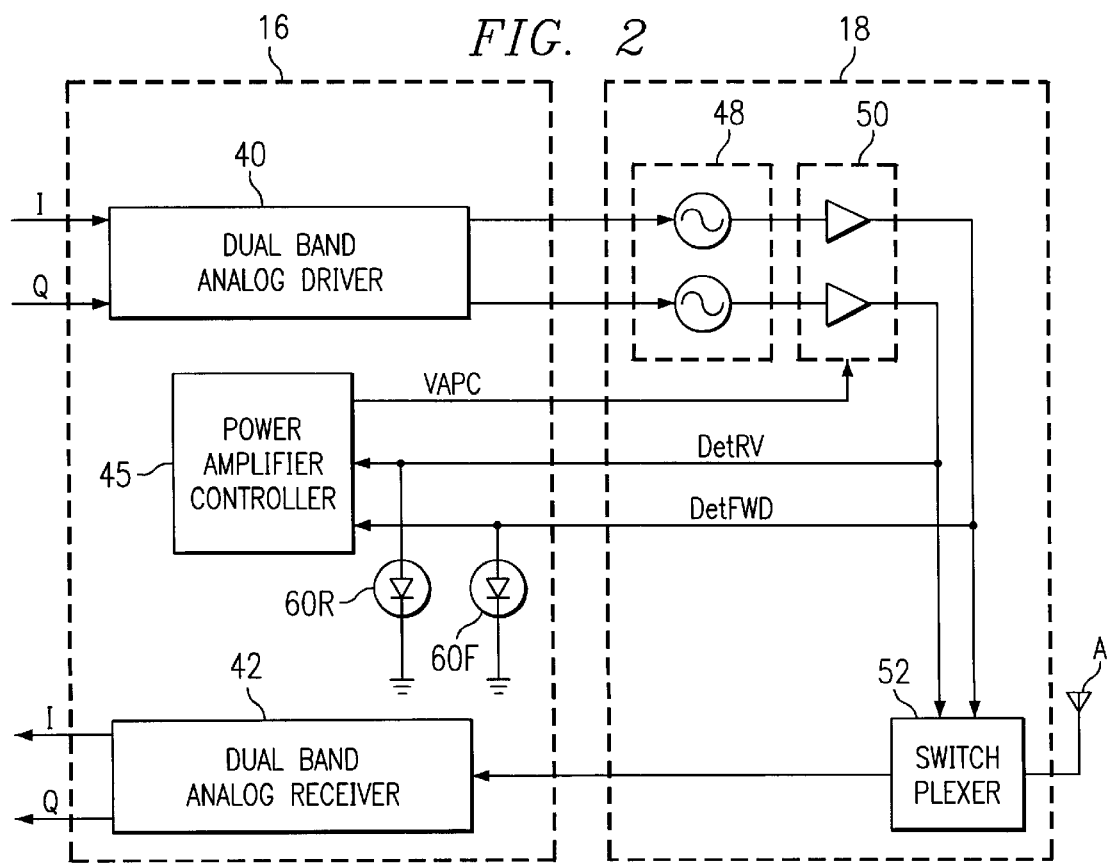
FIG. 2 is an electrical diagram, in block form, of an RF transceiver in the wireless telephone of FIG. 1, according to the preferred embodiment of the invention.

Referring now to FIG. 2, the construction of RF transceiver 16, and its cooperative connection with the transmit side of power amplifiers and receivers block 18, will now be described in detail. In this example, RF transceiver 16 includes dual band analog driver 40, which receives digital datastreams representing in-phase and quadrature components I,Q of the phase and amplitude modulated signals to be generated by dual band analog driver 40. Dual band analog driver 40 generates corresponding analog signals to modulate the desired carrier frequencies, in either of two transmission bands (e.g., Bluetooth and GPRS bands). Preferably, dual band analog driver 40 includes an N-fractional synthesizer for producing the desired analog signals.

As shown in FIG. 2, the dual band output from dual band analog driver 40 is forwarded to dual-band voltage controlled oscillator (VCO) 48 in power amplifiers and receiver block 18. Dual-band VCO 48 includes two VCOs, oscillating at the desired nominal carrier frequency in the two respective transmission frequency bands. The analog signals from dual band analog driver 40 modulates the VCOs in dual-band VCO 48 according to the modulating signals I, Q received from analog baseband function 14. The two output signals from dual-band VCO 48, which corresponds to QAM signals in the respective bands, are then amplified by power amplifiers 50 and applied to antenna A via switchplexer 52.

On the receive side, signals received at antenna A are forwarded to dual band analog receiver 42 by switchplexer 52. Dual band analog receiver 42, in this exemplary implementation, is a direct-conversion receiver operable in multiple frequency bands, such as the Bluetooth and GPRS bands, to generate digital datastreams of in-phase and quadrature components I, Q of the received phase and amplitude modulated signals. These components I, Q are forwarded to analog baseband function 14 and digital baseband function 12 (FIG. 1), for processing and output to the user of wireless telephone 10.

Also as shown in FIG. 2, RF transceiver 16 includes power amplifier controller 45. Power amplifier controller 45 has control inputs at nodes DetFWD and DetRV, at which the outputs of power amplifiers 50 are coupled to the anodes of Schottky diodes 60F, 60R, respectively. From these control inputs, power amplifier controller 45 detects the output power currently being generated by power amplifiers 50, and uses these detected power levels to generate a control signal, on line VAPC, that is applied to power amplifiers 50 to adjust the output power. Power amplifier controller 45 thus effects closed-loop control of power amplifiers 50.

Figure 3:
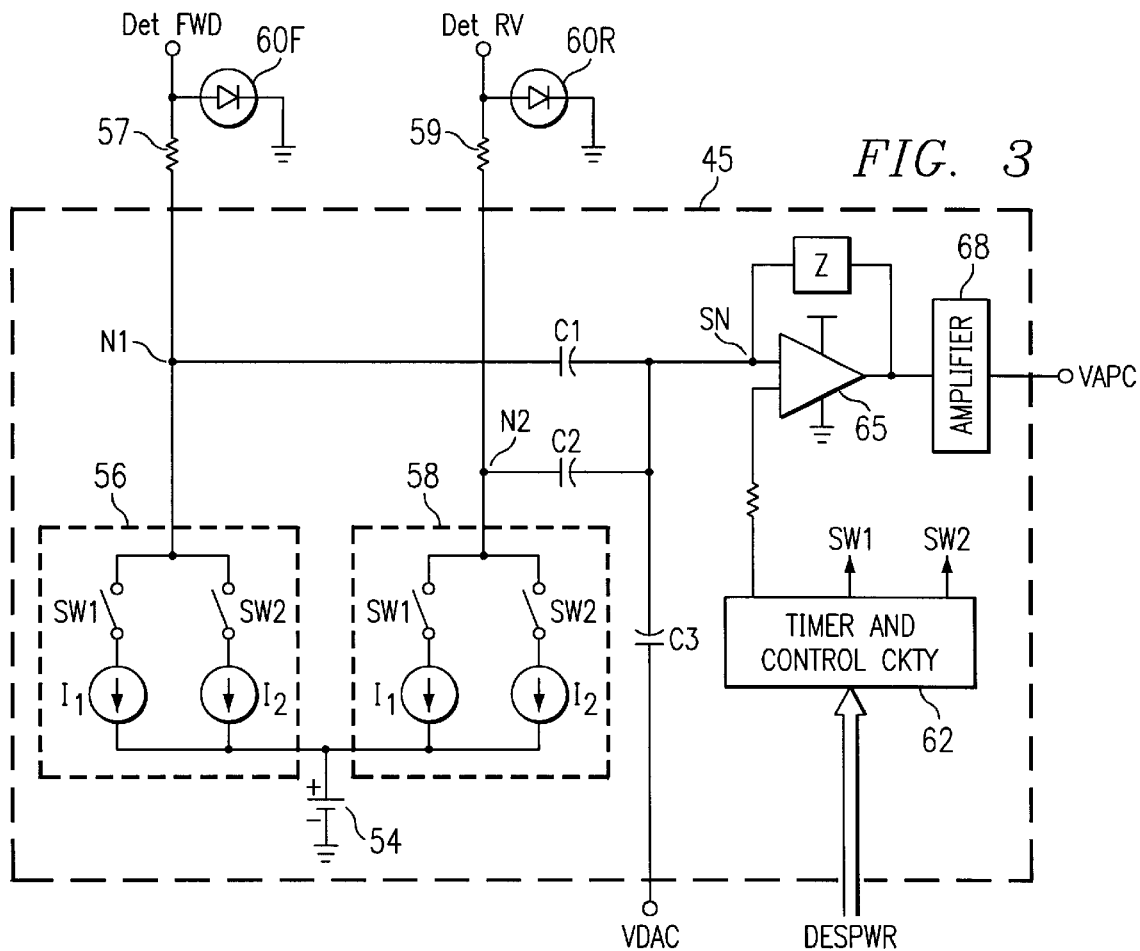
FIG. 3 is an electrical diagram, in block and schematic form, of power amplifier controller circuitry in the RF transceiver of FIG. 2, according to the preferred embodiment of the invention.

Referring now to FIG. 3, the construction and operation of power amplifier controller 45 according to the preferred embodiment of the invention will now be described. As discussed above relative to FIG. 2, power amplifier controller 45 is operable to detect power inputs at two nodes of DetFWD and DetRV, which are connected to the anodes of Schottky diodes 60F, 60R, respectively. The cathodes of Schottky diodes 60F, 60R are connected to ground. According to the preferred embodiment of the invention, bias current is applied to Schottky diodes 60F, 60R by switchable current sources 56, 58, respectively, through resistors 57, 59, respectively.

The orientation of Schottky diodes 60F, 60R as shown in FIGS. 2 and 3 in this embodiment of the invention is presented by way of example only. Other implementations of Schottky diode power detectors are known in the art, and may be used in the alternative to the arrangement illustrated in FIGS. 2 and 3. For example, the orientation of Schottky diodes may be reversed from that shown in FIGS. 2 and 3 for some implementations, or alternatively the detector circuit can be modified to place Schottky diodes 60F, 60R in series with the detected power. In each case, selectable bias currents conducted by the Schottky diodes may be applied, in the manner described in this specification. It is contemplated that these and other alternative implementations are within the scope of the invention as claimed.

According to the preferred embodiment of the invention illustrated in FIGS. 2 and 3, the two power levels of power amplifiers 50 can correspond to various functions. For example, in the case where power amplifiers 50 are driving a directional coupler, one sensed power level (e.g., at terminal DetFWD) can be the power driven by power amplifiers 50, in which case the other sensed power level (e.g., at terminal DetRV) is reflected power from antenna A. In nominal operation, the reflected power sensed at DetRV is near zero; however, if load conditions are sufficiently out of balance that significant power is reflected into wireless unit 10, the sensing of reflected power can be used to reduce the power driven by power amplifiers 45 to prevent damage to wireless unit 10. Alternatively, the sensed power levels can correspond to the driven power of each of multiple transmission bands, as will be useful in dual-band wireless unit 10. It is contemplated that those skilled in the art having reference to this specification will be readily able to use these multiple power sensing inputs to power amplifier controller 45 for a wide variety of useful purposes.

In any case, referring to FIG. 3, controllable current sources 56, 58 supply a selectable bias current, through resistors 57, 59, respectively, to each of Schottky diodes 60F, 60R. According to this preferred embodiment of the invention, each of controllable current sources 56, 58 include a current source sourcing bias current I1, a current source sourcing bias current I2, and switches SW1, SW2 for selectably coupling one or the other of bias currents I1, I2 to the corresponding Schottky diode 60F, 60R. These current sources are preferably constructed in the conventional manner, for example by way of a metal-oxide-semiconductor (MOS) transistor biased by DC power supply 54 and having its gate controlled by a regulated reference voltage, such as may be generated by a bandgap reference circuit or the like. As will be described in detail below, switches SW1, SW2 are controlled by timer and control circuitry 62 responsive to the digital input signal on lines DESPWR, which indicates the power level of power amplifiers 45 that is desired for wireless unit 10. It is contemplated that desired power level input DESPWR is driven by the appropriate control circuit in wireless unit 10, whether as part of digital baseband 12 or analog baseband 14.

Sense node N1, at the junction between controllable current source 56 and resistor 57, is capacitively coupled by weighting capacitor C1 to sum node SN, which is at one input of summing adder 65; similarly, sense node N2, at the junction between controllable current source 58 and resistor 59, is capacitively coupled by weighting capacitor C2 to sum node SN. Reference voltage VDAC is capacitively coupled by weighting capacitor C3, also to sum node SN. In this arrangement of Schottky diodes 60F, 60R, resistors 57, 59, and controllable current sources 56, 58, Schottky diodes 60F, 60R operate to present a voltage at their corresponding sense nodes N1, N2 that is the negative of the power level generated by the corresponding power amplifiers 50 at nodes DetFWD, DetRV, respectively. On the other hand, reference voltage VDAC is a desired voltage level for power amplifiers 50.

Summing adder 65 is configured as a differential operational amplifier, having an inverting input connected to sum node SN, and a non-inverting input coupled to timer and control circuitry 62 to receive an offset level; summing adder 65 also includes the necessary switching feedback network for effecting the summing operation. The output of summing adder 65 is applied to amplifier 68, which integrates and amplifies the error signal output from summing adder 65 into the appropriate power level control signal that is applied to power amplifiers 50 on line VAPC.

In operation, summing adder 65 presents a voltage, at its output, corresponding to the weighted sum of the capacitively coupled inputs at its non-inverting input, which in this case is sum node SN, relative to the offset level from timer and control circuitry 62 that indicates the null level at which the weighted sum at sum node SN matches the desired power level. The weighting of the voltages at nodes N1, N2, and on line VDAC is effected by the relative sizes of the coupling capacitors C1, C2, C3, as is well known in the art. Accordingly, if power amplifiers 50 are currently applying power levels that correspond to the desired level of power indicated on line VDAC, weighted by the capacitances C1, C2, C3, the voltage at sum node SN will be the same as the voltage present on the non-inverting input of summing adder 65. The output of summing adder 65 is applied to amplifier 68, which in turn drives line VAPC with a voltage corresponding to the desired power level to be driven by power amplifiers 45.

Of course, other circuitry for controlling the output of power amplifiers 50 in response to their detected power output may be utilized. For example, a differential amplifier may be substituted for summing adder 65. Further in the alternative, digital techniques for sampling the detected power and digitally generating the power control signal may be used. It is contemplated that those skilled in the art having reference to this specification will be readily able to implement these and other alternatives, while remaining within the scope of the invention.

Figure 4:
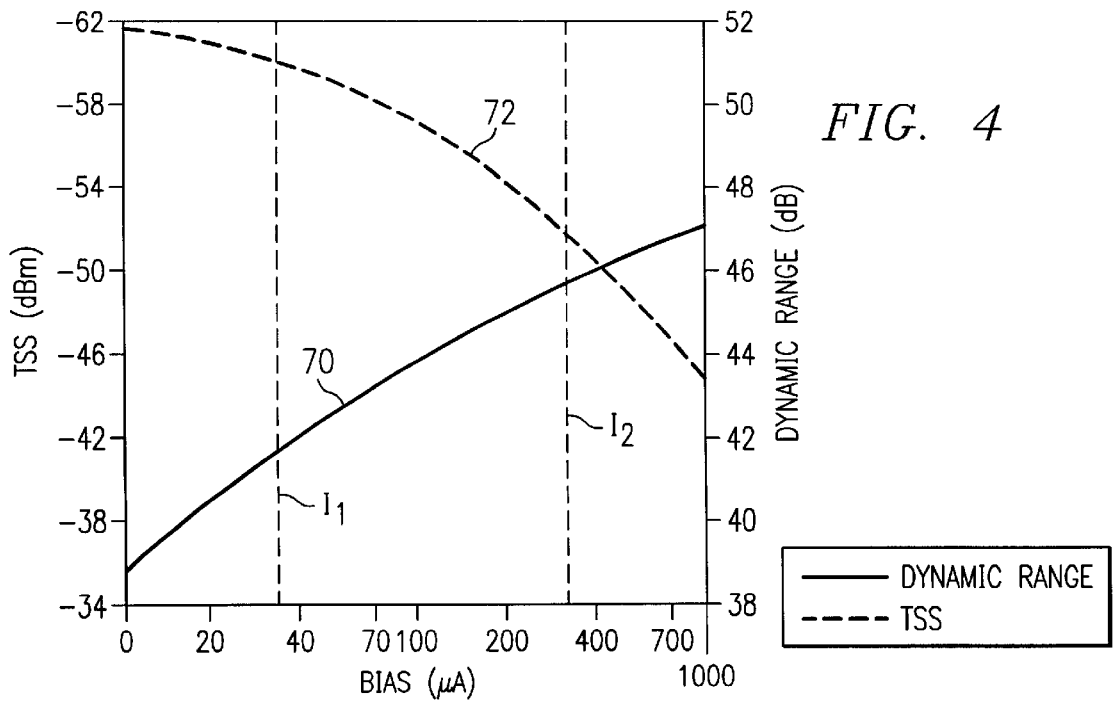
FIG. 4 illustrates plots of sensitivity and dynamic range versus bias current for Schottky diode power detectors as used in connection with the preferred embodiment of the invention.

Referring now to FIG. 4, plots of the sensitivity and the dynamic range of Schottky diodes 60 versus bias current, in their role as power detectors, is illustrated. The plot of FIG. 4 corresponds to FIG. 2 of "Dynamic Range Extension of Schottky-Detectors", Application Note 956-5 (Hewlett Packard Co., 1975). As shown in FIG. 4, plot 70 illustrates that the dynamic range of a Schottky diode detector, such as presented by Schottky diodes 60, increases from about 39 dB to about 47 dB as the bias current increases from 0 to 1000 $\mu$A. Similarly, the sensitivity of a Schottky diode detector, defined as tangential signal sensitivity (TSS), decreases from about −62 dBm to about −44 dBm as the bias current increases from 0 to 1000 $\mu$A. Plots 70, 72 clearly show that a tradeoff between sensitivity and dynamic range exists in the operation of a Schottky diode power detector circuit.

According to the preferred embodiment of the invention, as shown in FIG. 3, bias current I1, I2, are available from controllable current sources 56, 58, by the operation of switches SW1, SW2. In this example, bias current I1 is about 30 $\mu$A, while bias current I2 is about 300 $\mu$A. Of course, more than two bias currents I1, I2 may be made available from controllable current sources 56, 58, depending on the particular application. As shown in FIG. 4, bias current I1 of 30 $\mu$A can result in a relatively low dynamic range of about 42 dB but a relatively high sensitivity of about −60 dBm. Conversely, a bias current I2 of about 300 $\mu$A provides a relatively high dynamic range of about 45 dB with a reduced sensitivity of about −47 dBm.

This behavior of Schottky diode detectors 60F, 60R is used to advantage in power amplifier controller 45, as will now be described in detail with reference to FIG. 3. Timer and control circuitry 62 receives a digital word, on lines DESPWR, indicating the power level to which power amplifiers 50 are to be driven, under the control of a signal on line VAPC. Timer and control circuitry 62 presents a corresponding signal to summing adder 65, to begin driving line VAPC to the desired power level. In anticipation of this future power level as indicated on lines DESPWR, timer and control circuitry 62 controls switches SW1, SW2 in controllable current sources 56, 58 to bias Schottky diodes 60 to the optimal operating point for that power level.

For example, if the signal on lines DESPWR indicate a relatively low power level to be driving by power amplifiers 50, timer and control circuitry 62 may issue control signals to close switches SW1 and open switches SW2. As a result, bias current I1 will be applied to bias Schottky diodes 60F, 60R. In this state, the power level detection performed by power amplifier controller 45 will be at a high sensitivity but reduced dynamic range, which is well-suited for low power operation. Conversely, if lines DESPWR indicate that a relatively high power level is to be driven by power amplifiers 50, timer and control circuitry 62 can issue control signals that open switches SW1 and close switches SW2, to apply higher bias current I2 to Schottky diodes 60F, 60R. With this higher bias current, the power level detection performed by power amplifier controller 45 will have a high dynamic range, but reduced sensitivity, which is well-suited for high power level operation.

The ability to adjust these Schottky bias currents provides power amplifier controller 45 with optimal dynamic range and optimal sensitivity, without necessarily trading off one against the other. In low power situations, dynamic range is of less concern than is sensitivity to small signal variations; the lower bias current (I1 in the example of FIGS. 3 and 4) enables this class of operation. In high power situations, sensitivity to small signal variations is of less concern than is dynamic range, in which case the higher bias current (I2 in the example of FIGS. 3 and 4) enables such operation. The controllability of these bias currents therefore avoids the necessity to make a tradeoff between sensitivity and dynamic range.

Accordingly, the present invention enables the use of Schottky diode power detection circuits in high dynamic range, high sensitivity applications such as wireless handsets. Excellent power detection performance is provided, while avoiding the high cost and high complexity that conventional logarithmic detectors present to modern wireless telephone equipment.

Again, many variations in the particular construction of power amplifier controller circuitry will be apparent to those skilled in the art having reference to this description. For example, more than two bias current levels may be implemented, for example by including a medium power level bias current that provides medium sensitivity and medium dynamic range. By way of another example, more or fewer than two power level inputs may be provided, depending upon the control functions desired, may also be implemented.

Figure 5A:
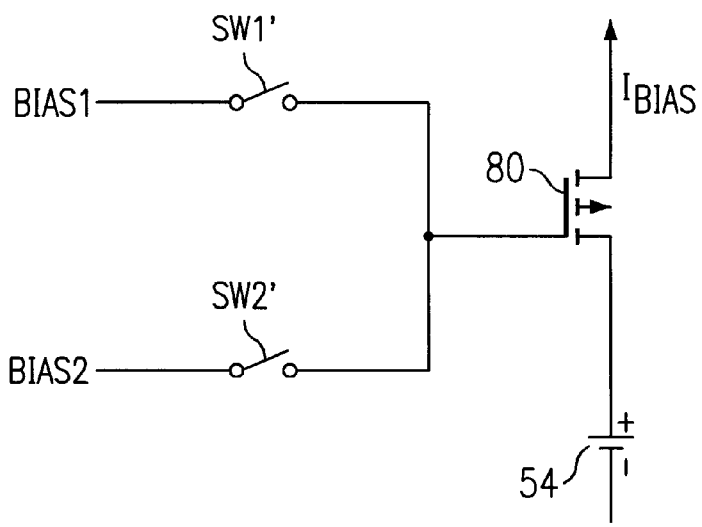
FIGS. 5a and 5b are electrical diagrams, in schematic form, of alternative implementations of controllable current sources according to the preferred embodiments of the invention.

Further in the alternative, each controllable current source may be implemented by way of a single current source transistor, to which different bias voltages are switchably applied in response to the future power level. FIG. 5a illustrates such an alternative controllable current source 56', in which MOS transistor 80 serves as the current source. MOS transistor 80 has its source biased by power supply voltage 54, and its drain coupled to its corresponding Schottky diode (not shown). Of course, transistor 80 may be either a p-channel or an n-channel device, with its source/drain bias arranged in the conventional manner to serve as a current source. In this alternative implementation, the gate of transistor 80 receives one of bias voltages BIAS1, BIAS2, via switches SW1', SW2'. The states of switches SW1', SW2' are controlled by timer and control circuitry 62 (FIG. 3) to select the level of bias current $I_{BIAS}$ to be applied to its Schottky diode, responsive to the desired power level signal DESPWR, as described above.

Figure 5B:
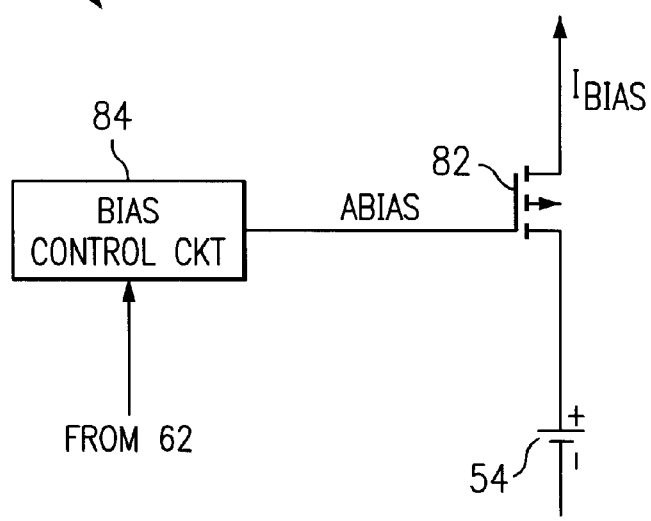

Still further in the alternative, each controllable current source may be implemented by way of an analog controlled transistor, so that the bias current can be set to any current level within a continuous range, to precisely optimize the power level detection function. FIG. 5b illustrates such an alternative implementation of controllable current source 56", in which MOS transistor 82, serving as the current source device, has its source biased by power supply voltage 54 and its drain coupled to its corresponding Schottky diode (not shown). According to this alternative implementation, an analog controlled bias voltage ABIAS is applied to the gate of transistor 82, for example by bias control circuit 84 under the control of timer and control circuitry 62 (FIG. 3). In this manner, an analog bias voltage ABIAS is applied to the gate of transistor 82 to precisely set the level of Schottky bias current $I_{BIAS}$ in response to the desired power level signal DESPWR communicated to timer and control circuitry 62.

It is contemplated that these and other alternatives to the controllable current sources, and to the construction of the power amplifier controller, as well as the systems within which these functions are embodied, are within the scope of the invention as claimed.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A power amplifier controller circuit, comprising:
   a first terminal coupled to an output of a power amplifier;
   a first Schottky diode coupled to the first terminal;
   a first controllable current source coupled to the first Schottky diode, for applying one of a plurality of selectable bias currents to the first Schottky diode; and
   a control circuit for receiving a desired power signal, and for controlling the first controllable current source to apply one of the plurality of bias currents responsive to the desired power signal.

2. The circuit of claim 1, wherein the first controllable current source comprises:
   a plurality of current sources, biased from a power supply voltage; and
   a plurality of switches, each connected in series between an associated one of the plurality of current sources and the Schottky diode, the plurality of switches controlled by the control circuit.

3. The circuit of claim 1, wherein the first controllable current source comprises:
   a current source transistor, having a conduction path biased from a power supply voltage, and having a control electrode; and
   a bias selection circuit for applying a selected bias voltage to the control electrode of the current source transistor, responsive to the control circuit.

4. The circuit of claim 3, wherein the selected bias voltage is an analog controlled voltage.

5. The circuit of claim 1, further comprising:
   a second terminal coupled to an output of a power amplifier;
   a second Schottky diode coupled to the second terminal; and
   a second controllable current source coupled to the second Schottky diode and to the control circuit, for applying one of a plurality of selectable bias currents to the second Schottky diode responsive to the desired power signal applied to the control circuit.

6. The circuit of claim 1, further comprising:
   an amplifier, coupled to the first Schottky diode, for generating a control signal to be applied to the power amplifier responsive to a power level detected at the first Schottky diode.

7. The circuit of claim 6, further comprising:
   a second terminal coupled to an output of a power amplifier;
   a second Schottky diode coupled to the second terminal; and
   a second controllable current source coupled to the second Schottky diode and to the control circuit, for applying one of a plurality of selectable bias currents to the second Schottky diode responsive to the desired power signal applied to the control circuit.

8. The circuit of claim 7, further comprising:
   a summing adder, having a first input coupled to a sum node and a second input coupled to receive a control signal, and having an output coupled to an input of the amplifier;
   first and second capacitors, for coupling the sum node to the first and second Schottky diodes, respectively; and
   a third capacitor, for coupling a power level input signal to the sum node.

9. A wireless communications device, comprising:
   an antenna;
   power amplifier and receiver circuitry, coupled to the antenna, for driving the antenna with transmission signals and for receiving signals from the antenna;
   digital and analog circuitry for processing signals to be transmitted and signals received from the antenna; and
   a power amplifier controller circuit, having at least one input coupled to at least one output of the power amplifier and receiver circuitry, and having an output coupled to the power amplifier and receiver circuitry, and comprising:
   a first Schottky diode coupled to a first one of the inputs;
   a first controllable current source coupled to the first Schottky diode, for applying one of a plurality of selectable bias currents to the first Schottky diode; and a control circuit for receiving a desired power signal, and for controlling the first controllable current source to apply one of the plurality of bias currents responsive to the desired power signal; and an amplifier, coupled to the first Schottky diode, for generating a control signal to be applied to the power amplifier responsive to a power level detected at the first Schottky diode.

10. The device of claim 9, wherein the first controllable current source comprises:

a plurality of current sources, biased from a power supply voltage; and a plurality of switches, each connected in series between an associated one of the plurality of current sources and the Schottky diode, the plurality of switches controlled by the control circuit.

11. The device of claim 9, wherein the first controllable current source comprises:

a current source transistor, having a conduction path biased from a power supply voltage, and having a control electrode; and a bias selection circuit for applying a selected bias voltage to the control electrode of the current source transistor, responsive to the control circuit.

12. The circuit of claim 11, wherein the selected bias voltage is an analog controlled voltage.

13. The device of claim 9, further comprising:

a second Schottky diode coupled to a second one of the inputs; and a second controllable current source coupled to the second Schottky diode and to the control circuit, for applying one of a plurality of selectable bias currents to the second Schottky diode responsive to the desired power signal applied to the control circuit.

14. The device of claim 13, wherein the first one of the inputs is coupled to the power amplifier and receiver circuitry so as to receive a forward power input;

and wherein the second one of the inputs is coupled to the power amplifier and receiver circuitry so as to receive a reflected power input.

15. The device of claim 13, wherein the power amplifier and receiver circuitry is operable to transmit signals in a plurality of frequency bands;

wherein the first one of the inputs is coupled to the power amplifier and receiver circuitry to receive a power input from a first one of the plurality of frequency bands;

and wherein the second one of the inputs is coupled to the power amplifier and receiver circuitry to receive a power input from a second one of the plurality of frequency bands.

16. The device of claim 13, further comprising:

a summing adder, having a first input coupled to a sum node and a second input coupled to receive a control signal, and having an output coupled to an input of the amplifier;

first and second capacitors, for coupling the sum node to the first and second Schottky diodes, respectively; and a third capacitor, for coupling a power level input signal to the sum node.

17. A method of controlling the output of power amplifiers in a communications device, comprising:

receiving a desired power signal indicating a future power level to be driven from the power amplifiers;

responsive to the desired power signal, applying one of a plurality of bias currents to at least one Schottky diode coupled to an output of the power amplifiers;

comparing a voltage from the at least one Schottky diode, the voltage corresponding to a power output from the power amplifiers, to a power input signal to produce a control signal applied to the power amplifiers.

18. The method of claim 17, wherein the applying step comprises:

responsive to the desired power signal corresponding to a low power range, applying a first bias current to the at least one Schottky diode;

responsive to the desired power signal corresponding to a high power range, applying a second bias current to the at least one Schottky diode, the second bias current being higher than the first bias current.

19. The method of claim 17, wherein the applying step applies the one of a plurality of bias currents to first and second Schottky diodes coupled to an output of the power amplifiers.

20. The method of claim 19, wherein the comparing step comprises:

applying first and second voltages from the first and second Schottky diodes to a sum node, the first and second voltages corresponding negatively to first and second power outputs of the power amplifiers;

applying the power input signal to the sum node; and coupling the sum node to a summing adder, the summing adder generating an output corresponding to the sum of the power input signal and the first and second voltages; and deriving the control signal from the output of the summing adder.

* * * * *